United States Patent
Lee et al.

(10) Patent No.: US 8,739,087 B1
(45) Date of Patent: May 27, 2014

(54) SYSTEM AND METHOD FOR LARGE MULTIPLEXER IDENTIFICATION AND CREATION IN A DESIGN OF AN INTEGRATED CIRCUIT

(71) Applicant: Atrenta, Inc., San Jose, CA (US)

(72) Inventors: Tien-Chien Lee, San Jose, CA (US); Saurabh Verma, Noida (IN); Satrajit Pal, Noida (IN); Chandra Manglani, Noida (IN); Jitendra Kumar, Pleasanton, CA (US); Mohammad H. Movahed-Ezazi, Saratoga, CA (US)

(73) Assignee: Atrenta, Inc., San Jose, CA (US)

( * ) Notice: Subject to any disclaimer, the term of this patent is extended or adjusted under 35 U.S.C. 154(b) by 0 days.

(21) Appl. No.: 13/756,083

(22) Filed: Jan. 31, 2013

(51) Int. Cl.
*G06F 17/50* (2006.01)

(52) U.S. Cl.
USPC .......................................................... 716/104

(58) Field of Classification Search
USPC .......................................................... 716/104
See application file for complete search history.

(56) References Cited

U.S. PATENT DOCUMENTS

| | | | |
|---|---|---|---|
| 6,020,756 A | 2/2000 | New | |
| 6,118,300 A * | 9/2000 | Wittig et al. | 326/41 |
| 6,191,610 B1 | 2/2001 | Wittig et al. | |
| 6,487,698 B1 | 11/2002 | Andreev et al. | |
| 6,505,337 B1 | 1/2003 | Wittig et al. | |
| 6,556,042 B1 * | 4/2003 | Kaviani | 326/39 |
| 6,594,816 B1 | 7/2003 | Hauck | |
| 7,404,155 B1 * | 7/2008 | Nancekievill et al. | 326/41 |
| 7,506,278 B1 * | 3/2009 | Rjimati et al. | 716/104 |
| 7,735,045 B1 | 6/2010 | Van Mau et al. | |
| 7,934,180 B2 | 4/2011 | Baumgartner et al. | |
| 2007/0083844 A1 | 4/2007 | Kabuo et al. | |
| 2008/0148214 A1 * | 6/2008 | Yancey et al. | 716/18 |

* cited by examiner

*Primary Examiner* — Jack Chiang
*Assistant Examiner* — Mohammed Alam
(74) *Attorney, Agent, or Firm* — Thomas Schneck; Mark Protsik (57) ABSTRACT

In the process of designing an integrated circuit (IC), it is often the case that a functional description is converted into multiplexers. In some cases it would be more efficient to combine two or more multiplexers into a larger multiplexer to identify potential design problems in the original register transfer level (RTL). Such early detection can prevent routing congestion problem that would be too expensive to fix later. A large multiplexer is defined as a multiplexer having a number of inputs and control signals that is above a predetermined threshold. When such a multiplexing functionality is detected that function may be replaced in the circuit with a large multiplexer that would be a more efficient implementation. Accordingly the circuit is checked for existence of multiplexing functions, and merging, when possible, of such multiplexing functions to achieve the ability to instantiate the multiplexing functionality with a large multiplexer.

19 Claims, 6 Drawing Sheets

SYSTEM AND METHOD FOR LARGE MULTIPLEXER IDENTIFICATION AND CREATION IN A DESIGN OF AN INTEGRATED CIRCUIT

TECHNICAL FIELD

The technical field of the present disclosure relates generally to computer-aided design (CAD) of integrated circuits, and more specifically to logic and circuit synthesis using register transfer level (RTL) coding.

BACKGROUND

Today's advanced integrated circuit (IC) designs involve description of the circuits using a high-level description language or hardware description language (HDL), such as the Very High-Level Design Language (VHDL) (alternatively VHSIC very high speed integrated circuits hardware description language) or Verilog®. Synthesis tools then use this description to generate a circuit description for the electrical implementation of the IC. This lower level description includes gates, ports, memory, multiplexers and the like. Eventually, the IC design is further reduced to a transistor level description that is used in the actual layout of the IC.

A logic description written in VHDL or Verilog is an RTL (register transfer level) description, i.e. VHDL and Verilog are HDLs (hardware description languages) in which an RTL description can be written. An RTL description is mapped into a gate level description or netlist. Netlists can be physical or logical. An RTL description (or a VHDL description) can be mapped onto a CPLD (complex programmable logic device), FPGA (field programmable gate array) or full custom chip at the logic gate (logic gates and wires as schematic symbols) and finally at the transistor level and maskmaking level (transistors and wires as geometries and layers on an integrated circuit), using an EDA (electronic design automation) tool, i.e. EDA software. The netlist is then used for verification that the physical implementation of the integrated circuit matches the RTL description.

Figure 1:
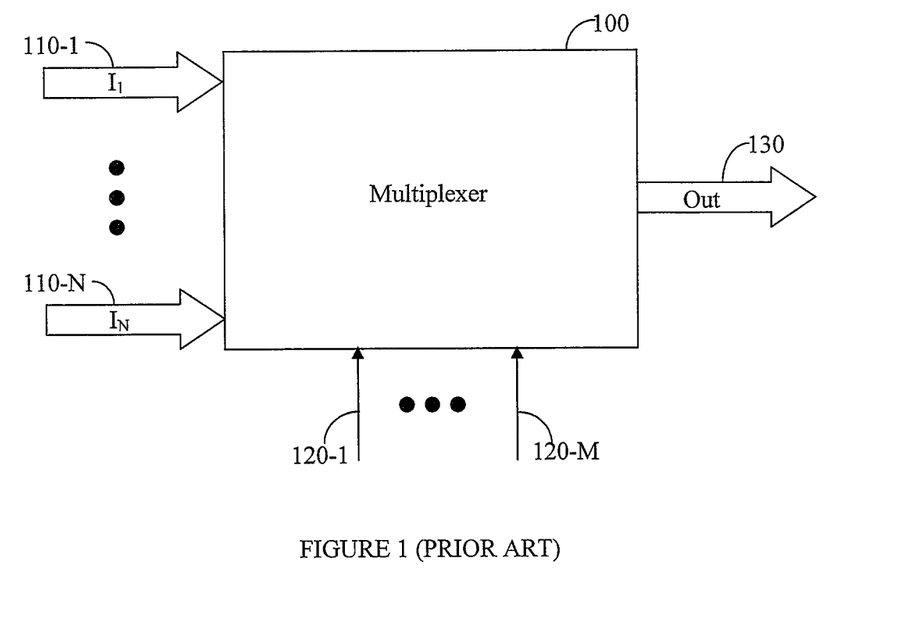
FIG. 1 is a schematic diagram of a known multiplexer.

High-level description languages may use various branching conditions such as all variants of case blocks, if-then-else blocks, ternary operators, array indexes, VHDL 'when' constructs, and VHDL 'with' constructs. Typically portions of such high-level description are eventually transformed into multiplexers (also known as muxes). An exemplary multiplexer 100 (also known as a mux) is shown in FIG. 1. The multiplexer has a plurality of inputs 110-1 through 110-N, N being an integer starting at '2', control signals 120-1 through 120-M, M being an integer starting at '1', and an output 130. The inputs 110-1 through 110-N may comprise of a signal or a bus, a bus being a combination of two or more signals. The output 130 of the multiplexer 100 can be a single bit, in the case of a multiple input single bit output multiplexer, or a multibit bus in the case of a multiple bus multiplexer.

In the process of transformation from a high-level description language of a circuit to a low-level description of the same circuit, multiple multiplexers may be created. The creation of many multiplexers may be inefficient in many ways, including, for example, routing congestion, larger IC area, and increased power consumption, to name but a few. It would therefore be advantageous to provide a solution that would capture the problems with the various multiplexing structures in the process of conversion from a high-level description of a circuit to the low-level description thereof.

SUMMARY

A method for synthesizing an integrated circuit design is provided, wherein the method comprises (1) receiving into a computer aided design (CAD) system a high-level description of a circuit; (2) identifying a multiplexing function in the high-level description, using at least one processor of the CAD system; (3) determining if the multiplexing function has a number of inputs and control signals that is above a predefined first threshold value, in a first determination using the at least one processor of the CAD system; (4) instantiating in a circuit-level description of the circuit a large multiplexer having characteristics of satisfying the multiplexing function and being larger than a minimum size multiplexer that can satisfy the multiplexing function, in response to the first determination being affirmative, using the at least one processor of the CAD system; and (5) storing the circuit-level description, including the instantiated large multiplexer, in an at least one memory of the CAD system.

A computer aided design (CAD) system is likewise provided, wherein the CAD system comprises (1) at least one processor; and (2) at least one memory coupled to the at least one processor, the at least one memory having contained therein instructions for execution that direct the at least one processor to (a) identify on a high-level description of a circuit a multiplexing function; (b) determine if the multiplexing function has a number of inputs and control signals that is above a predefined first threshold value, in a first determination; (c) generate or modify a circuit-level description of the circuit, so as to represent the multiplexing function from the high-level description by an instance of a large multiplexer having a greater number of inputs and control signals than the multiplexing function and satisfying the multiplexing function, in response to a positive result of the first determination; and (d) store the generated, or modified circuit-level description of the circuit, which includes the instance of the large multiplexer, in the at least one memory of the CAD system.

DETAILED DESCRIPTION

In the process of designing an integrated circuit (IC), it is often the case that a functional description of logic is converted into multiplexers. In some cases it would be more efficient to combine two or more multiplexers into a larger multiplexer, in order to prevent a potential design problem coded in the original register transfer level (RTL) description or model. Such early detection can prevent a routing congestion problem that would be too expensive to fix later. A large multiplexer is defined as a multiplexer having a number of inputs and control signals that is above a predetermined threshold. For example, and not by way of limitation, a large multiplexer may be considered a multiplexer having 16 input signals and 4 control signals for a total of 20 signals. In this case the threshold would be set at 19. Any multiplexer larger than a 2-to-1 multiplexer could be considered a large multiplexer and hence the minimum value for the threshold is 4, i.e., a multiplexer of 3-to-1. While a case of a single output is described it should not be viewed as limiting upon the invention, and a multiplexer having a plurality of output signals would equally enjoy the benefits of the invention. When such a multiplexing functionality is detected, that function may be replaced in the circuit with a large multiplexer that would be a more efficient implementation. Accordingly the circuit is checked for the existence of multiplexing functions. Merging, when possible, of such multiplexing functions achieves the ability to instantiate the multiplexing functionality with a large multiplexer.

Typically, high-level description languages use various branching conditions such as all variants of case blocks, if-then-else blocks, ternary operators, array indexes, VHDL 'when' constructs, and VHDL 'with' constructs. Generally, such high-level description is eventually transformed into multiplexers. Mostly, these are small multiplexers connected in cascade or in parallel. The use of a plurality of multiplexers, many times receiving the same inputs and a large number of common control signals, results in a routing congestions problem, increase in die area, and higher power consumption. Therefore, when possible, merging of smaller multiplexers into a large multiplexer overcomes these problems.

Figure 2:
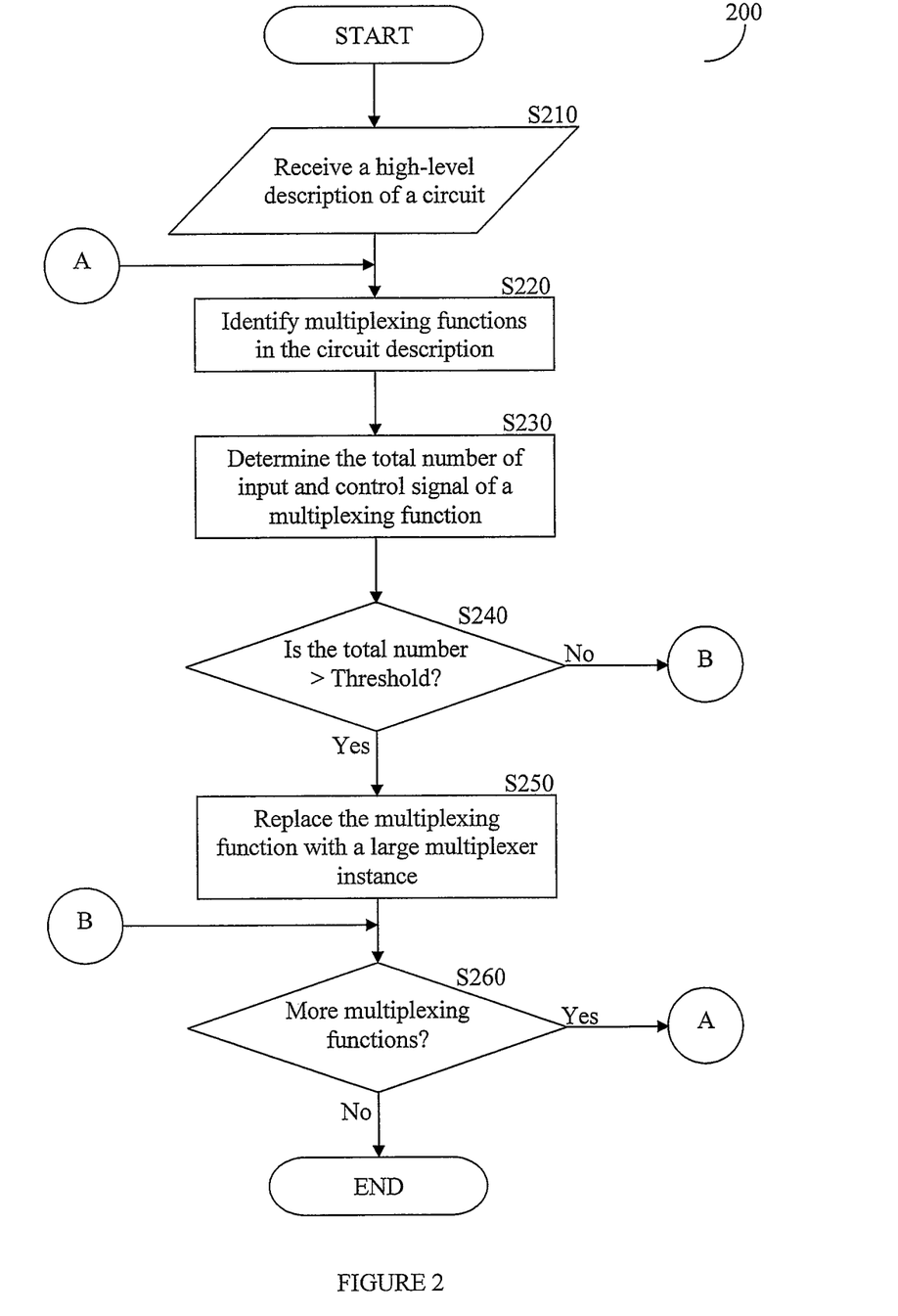
FIG. 2 is a flowchart showing identification and instantiation of a large multiplexer.

Reference is now made to FIG. 2 where an exemplary and non-limiting flowchart 200 describes an embodiment of identification and instantiation of a large multiplexer. In S210 a high-level description language, such as, but not by way of limitation, Very High-Level Design Language (VHDL) or Verilog, is received by a computer aided-design (CAD) system. Such a CAD system (discussed later as shown in FIG. 5) comprises, typically, a processing unit coupled to a memory, the memory containing instructions that when executed by the processing unit result in the proper performance of the CAD system. The CAD system is further equipped with the method described herein, and the memory typically contains the high-level circuit description. In block S220 the multiplexing functions of the high-level circuit description are identified. Such multiplexing functions include, but are not limited to, all variant of case blocks, if-then-else blocks, ternary operators, array indexes, VHDL 'when' constructs, and VHDL 'with' constructs. These and other multiplexing functions are typically implemented in a plurality of smaller multiplexing functions, and it would be advantageous to replace such a plurality of smaller multiplexing functions with one or more larger multiplexing functions, or large multiplexers in the hardware implementation. In block S230 the total number of inputs and control signals of a multiplexing function, of the identified multiplexing functions found in block S220, are determined and in block S240 it is checked whether the total number is above a predetermined threshold value and if so, execution continues with block S250; otherwise, execution continues with block S260. In block S250 the multiplexing function is replaced by a large multiplexer instance that is either available, e.g. in a library, or synthesized appropriately. In block S260 it is checked whether additional multiplexing functions are to be checked and if so, execution continues with block S220; otherwise, execution terminates. It should be understood by those of ordinary skill in the art that the total number may be a result of a weighted or unweighted addition of the number of input signals and control signals.

Figure 3:
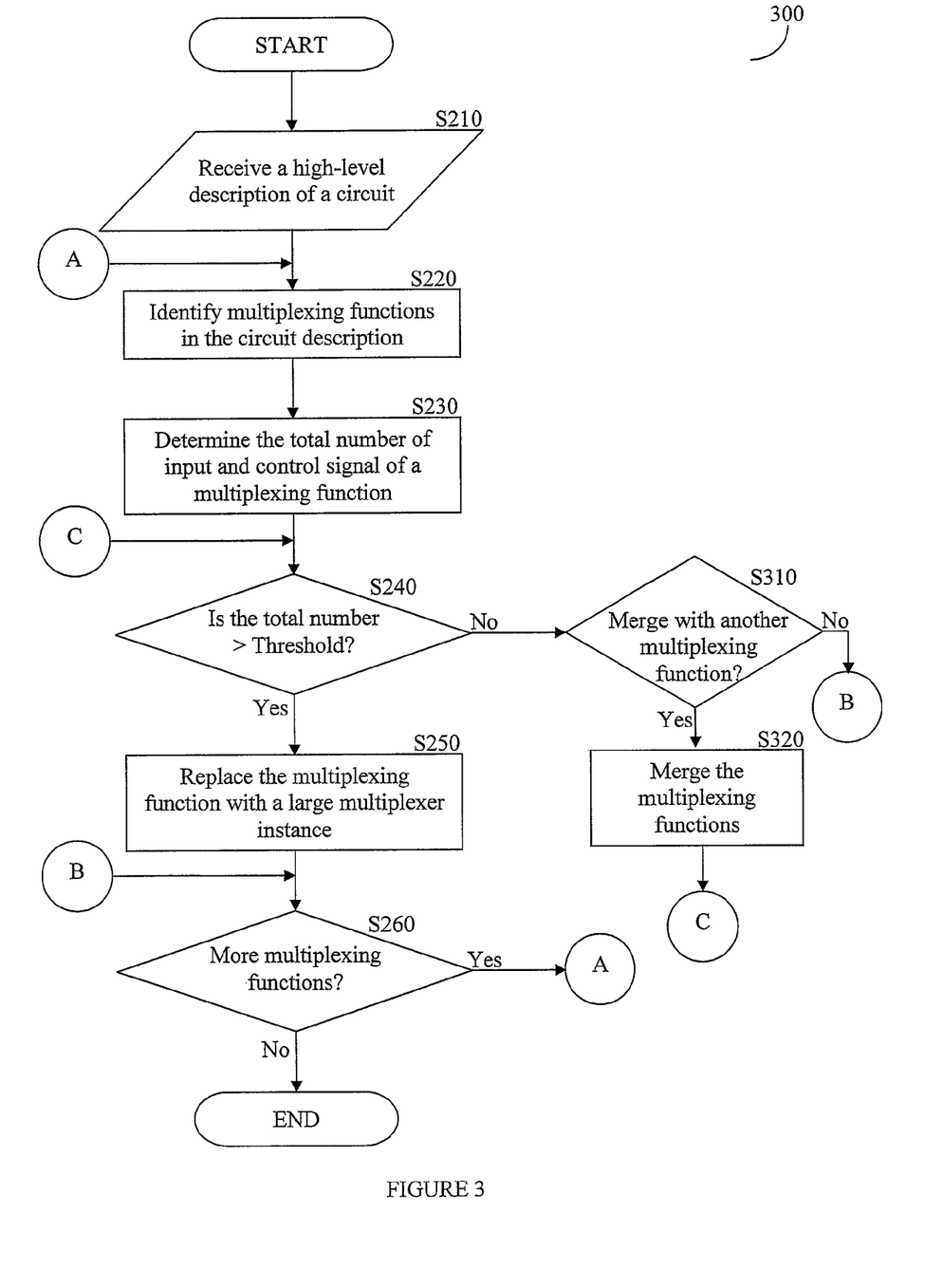
FIG. 3 is a flowchart showing identification, merging and instantiation of a large multiplexer.

FIG. 3 depicts an exemplary and non-limiting flowchart 300 of a modified embodiment of flowchart 200 for identification, merging and instantiation of a large multiplexer. Block S210, block S220, block S230, block S250 and block S260 were described with reference to FIG. 2. Their description is not repeated and the respective descriptions should be used herein. In block S240 it is checked whether the total number of inputs and control signals of a multiplexing function is above a predetermined threshold value and if so, execution continues with block S250; otherwise, execution continues with block S310. In block S310 it is checked if it is possible to merge the instant multiplexing function with another identified multiplexing function and if so, execution continues with block S320; otherwise, execution continues with block S260. In block S320 the instant multiplexing function and the selected identified multiplexing function are merged, as further described below, after which execution continues with block S240. By using the process described in FIG. 3, it is possible to merge multiplexing functions into a larger merged multiplexing function that has a total number of inputs and control signals that is above the predetermined threshold. In a further embodiment, the merging of multiplexing functions continues until it is not possible to merge any additional multiplexing function and only then is the total number of inputs and control signals checked against the threshold value. Doing this will allow reaching the largest possible multiplexer rather than ceasing the checks once it is determined that the threshold is met. The merged multiplexing function satisfies each of the multiplexing functions selected for merging.

Figure 4:
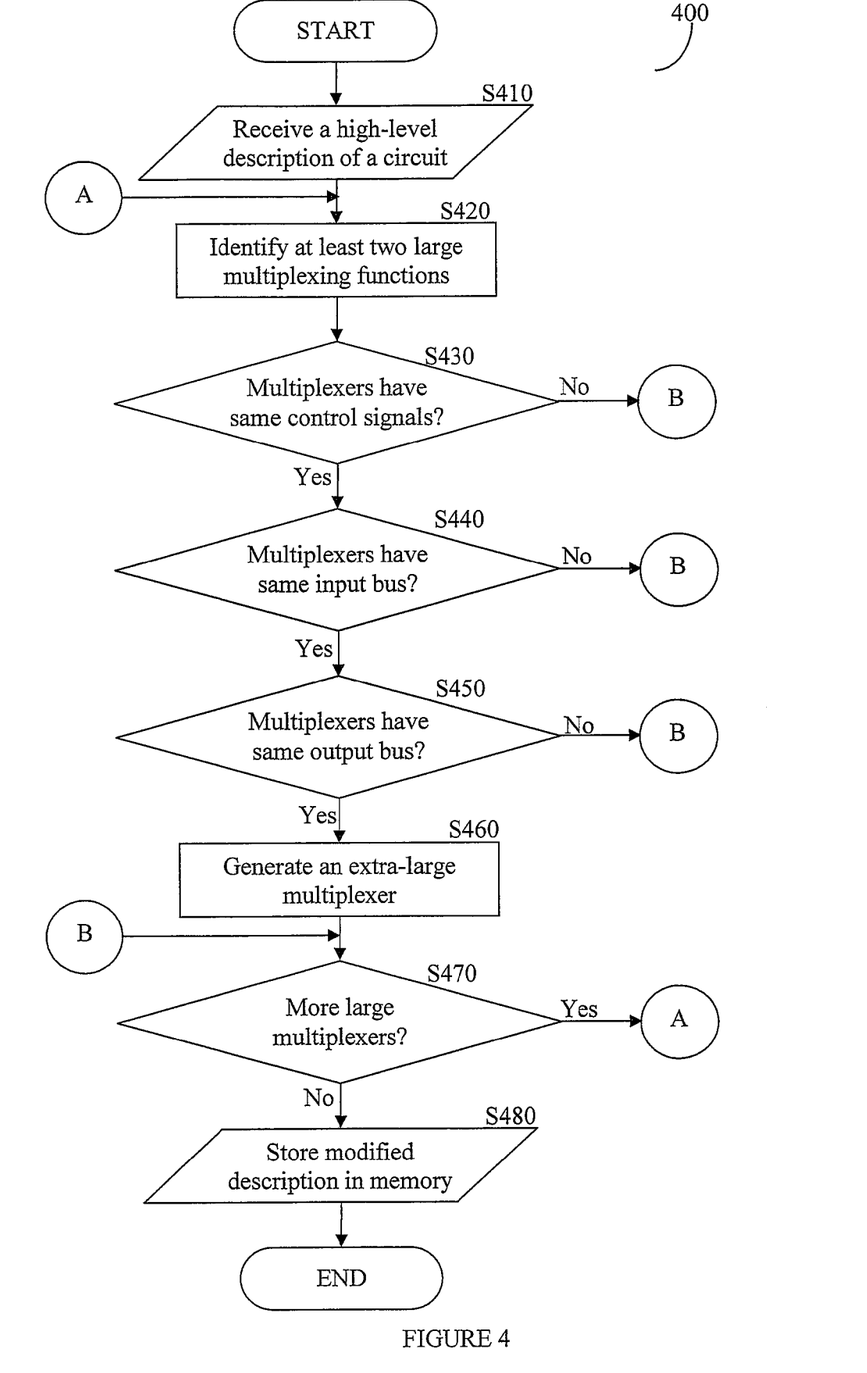
FIG. 4 is a flowchart showing identification, merging and instantiation of an extra-large multiplexer.

FIG. 4 depicts an exemplary and non-limiting flowchart 400 showing identification, merging and instantiation of an extra-large multiplexer. In 5410 a high-level description language, such as, but not by way of limitation, Very High-Level Design Language (VHDL) or Verilog, is received by a computer aided-design (CAD) system. Such a CAD system (discussed later as shown in FIG. 5) comprises, typically, a processing unit coupled to a memory, the memory containing instructions that when executed by the processing unit result in the proper performance of the CAD system. The CAD system is further equipped with the method described herein, and the memory typically contains the high-level circuit description. In S420 at least two large multiplexer functions are identified, a large multiplexing function defined as a multiplexing function having a number of input signal plus a number of control signals that is larger than a predefined value. In S430 it is checked whether the selected large multiplexing functions have common control signal; and if so execution continues with S440; otherwise, execution continues with S470. In 5440 it is checked whether the selected large multiplexing functions inputs belong to a single input bus, and if so execution continues with S450; otherwise, execution continues with S470. In S450 it is checked whether the selected large multiplexing functions outputs belong to a single output bus, and if so execution continues with S460; otherwise, execution continues with S470. In S460 the least two large multiplexer functions are merged into an instantiation of an extra-large multiplexing function. In S470 it is checked whether additional large multiplexers are to be handled and if so execution continues with S420; otherwise, execution continues with S480 where the modified circuit that includes at least an extra-large multiplexing function is stored in memory of the CAD system.

In the process of merging two or more multiplexing functions into a large multiplexer several actions may be taken as described below. The first action involves the identifying of multiplexer components that are candidates for merging. A large multiplexer is created based on the input side criteria (input width plus the select width>a predetermined threshold value) in the regular large multiplexer flow. In one embodiment an extra-large multiplexer is created based on output side criteria (output bus size>a predetermined output size threshold value) if the multiplexer-merge is used. All such large multiplexers are candidates for multiplexer-merge. Next determination of merge-feasibility using an adjacency test takes place, adjacency being defined as the output of a previous stage mux feeding into the input data bus of exactly one next stage mux instance and no other instances of any type. All output bits should feed into the same bus. That is, all the output bits should have exactly one fan-in and exactly one fan-out feeding from one another, where both are large-multiplexers. This includes identification of the multiplexers that can be merged together into a virtual larger-multiplexer according to the adjacency rules, where the combined multiplexer passes the input width+select width criteria as described in greater detail above. The merging process may repeated, as also noted above, thereby optimizing the largest multiplexer possible for a given set of multiplexing functions.

Figure 5A:
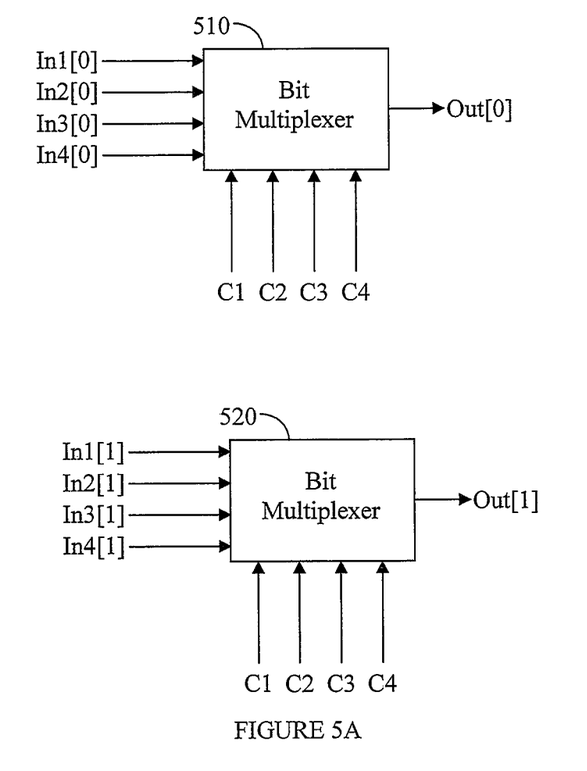
FIG. 5A is a block diagram of two multiplexing functions that are separate from each other.
Figure 5B:
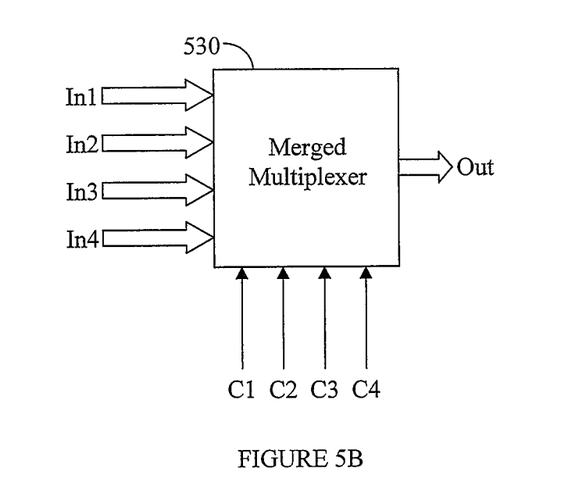
FIG. 5B is a block diagram of a merged multiplexing function according to an embodiment.

FIG. 5A shows an exemplary and non-limiting case of two multiplexing functions 510, 520. A multiplexing function 510 multiplexes the input signals In1[0], In2[0], In3[0] and In4[0] to Out[0], based on the condition signals C1, C2, C3 and C4. The same condition signals C1, C2, C3 and C4 also control the multiplexing of input signals In1[1], In2[1], In3[1] and In4[1] to Out[1] of the multiplexing function 520. According to the principles disclosed herein, and as further shown with respect to the exemplary and non-limiting FIG. 5B, the two multiplexing functions 510 and 520 are merged into a single large multiplexing function 530 whereby the condition signals C1, C2, C3 and C4 control the input signals In1[0:1], In2[0:1], In3[0:1] and In4[0:1] to Out[0:1], now shown as a bus and not a single signal. The example shown herein is merely for the purpose of illustration and should not be viewed as limiting the scope of the invention. Those of ordinary skill in the art would appreciate the other multiplexing functions, for example and without limitation, where the multiplexer are serially staged or cascaded, i.e., an output of one multiplexer drives an input of another multiplexer, as well as multiplexers controlled in whole or in part by different control signals, may also benefit from the principles of merging multiplexers into a larger multiplexer, using the teachings made herein.

A person of ordinary skill in the art may readily note that the synthesis of larger multiplexers is more complex and more time consuming for the synthesizer than the handling of smaller multiplexers. However, use of a large number of smaller multiplexers may result in more transistors and hence increased power consumption and delays, as well as a complex place and route problem causing significant congestion issues that result in increased place and route time and iterations, and larger overall die area. Therefore, such a person would realize the benefits of opting for merging of multiplexers according to the principles taught herein.

Figure 6:
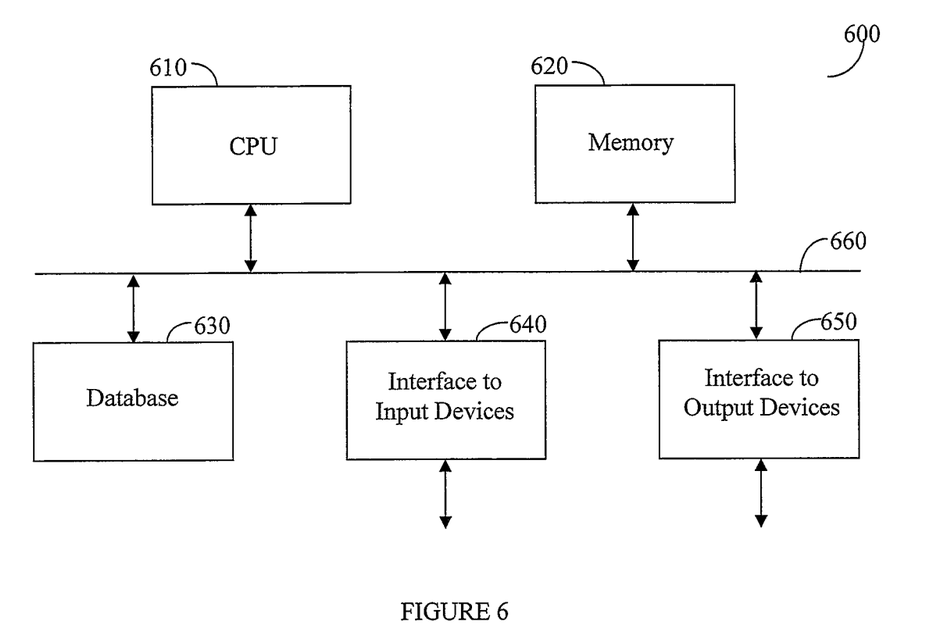
FIG. 6 is a schematic diagram of a computer-aided design (CAD) system, suitable for performing the operations shown on the flowcharts of FIGS. 2, 3 and 4.

The principles of the invention are implemented as hardware, firmware, software or any combination thereof, including but not limited to a computer aided design (CAD) system and software products thereof, the software designed to execute on an appropriate apparatus for execution of the plurality of instructions that are contained in the software. Moreover, the software is preferably implemented as an application program, comprising a plurality of instructions, tangibly embodied on a program storage unit or computer readable medium and executed on a computing device. The application program may be uploaded to, and executed by a machine comprising any suitable architecture. Preferably, the machine is implemented on a computer platform, a non-limiting example of which is shown in FIG. 6, having hardware such as one or more central processing units ("CPUs") 610, a memory 620, and input/output interfaces 640 and 650 respectively. The computer platform 600 may also include an operating system and microinstruction code that may be stored in memory 620 in part or in whole or in database 630 in part or in whole. The database 630 may further store a design of an IC being operated upon according to the principles disclosed herein. The computer platform 600 may include more than one memory or more than one type of memory. The various processes and functions described herein may be either part of the microinstruction code or part of the application program, or any combination thereof, which may be executed by the CPU 610, whether or not such computer or processor is explicitly shown. In addition, various other peripheral units (not shown) may be connected to the computer platform such as but not limited to a keyboard, a mouse, an additional data storage unit, a printing unit and/or display unit. The CPU 610, memory 620, database 630, interface to input devices 640 and interface to output devices 650 may communicate over a communication link 6560 which may be, but is not limited to, a bus, a network, and the likes. Modifications of the description of a circuit may be done in the RTL level and/or the net list level without departing from the scope of this invention.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure. The term "comprising" means including, such that a list of recited elements is open-ended, in that additional elements and additional ones of the recited elements can be added.

What is claimed is:

1. A method for synthesizing an integrated circuit design, the method comprising:
   receiving into a computer aided design (CAD) system a high-level description of a circuit;
   identifying a multiplexing function in the high-level description, using at least one processor of the CAD system;
   determining if the multiplexing function has a number of inputs and control signals that is above a predefined first threshold value, in a first determination using the at least one processor of the CAD system;
   instantiating in a circuit-level description of the circuit a large multiplexer having characteristics of satisfying the multiplexing function and being larger than a minimum size multiplexer that can satisfy the multiplexing function, in response to the first determination being affirmative, using the at least one processor of the CAD system; and
   storing the circuit-level description, including the instantiated large multiplexer, in an at least one memory of the CAD system.

2. The method of claim 1, further comprising merging at least one further multiplexing function with the multiplexing function to form a merged multiplexing function, prior to the instantiating;

wherein the large multiplexer instantiated in the circuit-level description of the circuit has further characteristics of representing the merged multiplexing function and satisfying the at least one further multiplexing function.

3. The method of claim 2, further comprising repeating merging still further multiplexing functions into the merged multiplexing function until no further multiplexing functions can be merged, prior to the instantiating;
wherein the large multiplexer instantiated in the circuit-level description of the circuit has a still further characteristic of satisfying the still further multiplexing functions.

4. The method of claim 1, wherein the high-level description of the circuit is provided in a CAD language selected from the group consisting of: very high-level design language (VHDL) and Verilog.

5. The method of claim 1, further comprising determining if a bus output of the multiplexing function is comprised of a number of signals that is larger than a predetermined second threshold, in a second determination; wherein the instantiating the large multiplexer is in response to the affirmative first determination and the second determination being affirmative.

6. A computer software product comprising a plurality of instructions embedded in a tangible and non-transient computer readable media, wherein when the instructions are executed by a computing device the method of claim 1 is performed.

7. A computer aided design (CAD) system comprising:
at least one processor; and
an at least one memory coupled to the at least one processor, the at least one memory having contained therein instructions for execution that direct the at least one processor to:
identify on a high-level description of a circuit a multiplexing function;
determine if the multiplexing function has a number of inputs and control signals that is above a predefined first threshold value, in a first determination;
generate or modify a circuit-level description of the circuit, so as to represent the multiplexing function from the high-level description by an instance of a large multiplexer having a greater number of inputs and control signals than the multiplexing function and satisfying the multiplexing function, in response to a positive result of the first determination; and
store the generated or modified circuit-level description of the circuit, which includes the instance of the large multiplexer, in the at least one memory of the CAD system.

8. The CAD system of claim 7, wherein:
the instructions further direct the at least one processor to merge at least one further multiplexing function with the multiplexing function, into a merged multiplexing function; and
the large multiplexer satisfies the merged multiplexing function.

9. The CAD system of claim 8, wherein:
the instructions further direct the at least one processor to iteratively merge still further multiplexing functions into the merged multiplexing function until no further multiplexing functions can be merged.

10. The CAD system of claim 7, wherein:
the instructions further direct the at least one processor to determine if a bus output of the multiplexing function is comprised of a number of signals that is larger than a predetermined second threshold, in a second determination; and
the generation or modification of the circuit-level description is in response to the positive result of the first determination and a positive result of the second determination.

11. A method of synthesizing a portion of a high-level description of an integrated circuit to a circuit-level description, comprising:
receiving a high-level description of a circuit into an at least one memory of a computer-aided design (CAD) system;
identifying a first multiplexing function and a second multiplexing function in the high-level description of the circuit, using at least one processor of the CAD system;
merging the first multiplexing function and the second multiplexing function into a merged multiplexing function, using the at least one processor of the CAD system upon a determination that a total number of inputs and control signals of the first multiplexing function and the second multiplexing function is above a predetermined threshold; and
instantiating the merged multiplexing function as a multiplexer in a circuit-level description of the circuit, so that the multiplexer represents the first and second multiplexing functions, using the at least one processor of the CAD system.

12. The method of claim 11 wherein instantiating the merged multiplexing function as a multiplexer that represents the first and second multiplexing functions includes:
deleting the first multiplexing function in the high-level description of the circuit;
deleting the second multiplexing function in the high-level description of the circuit; and
adding an instantiation of the multiplexer in the high-level description of the circuit, as a replacement of the first and second multiplexing functions;
wherein when the circuit-level description of the circuit is synthesized from the high-level description of the integrated circuit, which includes the instantiation of the multiplexer, the multiplexer is further instantiated in the circuit-level description of the circuit.

13. The method of claim 11 wherein instantiating the merged multiplexing function as a multiplexer that represents the first and second multiplexing functions includes:
deleting an instantiation of the first multiplexing function in the circuit-level description of the circuit;
deleting an instantiation of the second multiplexing function in the circuit-level description of the circuit; and
adding an instantiation of the multiplexer in the circuit-level description of the circuit, as a replacement of the first and second multiplexing functions.

14. The method of claim 11 wherein instantiating the merged multiplexing function as a multiplexer that represents the first and second multiplexing functions includes synthesizing the circuit-level description of the circuit from the high-level description of the circuit such that the multiplexer is instantiated in the circuit-level description in place of the first multiplexing function and the second multiplexing function.

15. The method of claim 11 wherein all outputs of the first multiplexing function are connected solely to at least one subset of inputs of the second multiplexing function and to no other inputs.

16. The method of claim 11 wherein the first multiplexing function and the second multiplexing function have at least one common control signal.

17. The method of claim 11 further comprising merging one or more further multiplexing functions into the merged multiplexing function, prior to instantiating the merged multiplexing function;

wherein the multiplexer further represents the one or more further multiplexing functions.

18. The CAD system including the at least one processor and the at least one memory of claim 11, wherein the CAD system is programmed to perform the method of synthesizing.

19. A tangible non-transitory computer-readable storage medium with an executable program stored thereon, wherein the program instructs a computer to perform the method of claim 11.

\* \* \* \* \*